United States Patent [19]

Koike et al.

[11] Patent Number: 4,603,829

[45] Date of Patent: Aug. 5, 1986

[54] SYSTEM FOR FIXEDLY MOUNTING A CASE OR THE LIKE BOX-SHAPED ARTICLE

[75] Inventors: Noboru Koike, Sagamihara; Hidenari Kitamura, Hachioji; Tsuneo Tomita, Kunitachi, all of Japan

[73] Assignee: Kabushiki Kaisha Toshiba, Kawasaki, Japan

[21] Appl. No.: 646,106

[22] Filed: Aug. 31, 1984

[30] Foreign Application Priority Data

Aug. 31, 1983 [JP] Japan .......................... 58-135912[U]

[51] Int. Cl.[4] .............................................. F16M 3/00
[52] U.S. Cl. ...................................... 248/553; 70/58; 248/657
[58] Field of Search ............... 248/553, 678, 657, 672, 248/552, 551, 677, 222.4, 223.1; 70/78, 165, 168, 58, 163, 164, 166, 169, 170, 171, 172, 173

[56] References Cited

U.S. PATENT DOCUMENTS

| | | | |
|---|---|---|---|
| 2,143,517 | 1/1939 | Huff | 220/3.5 |
| 2,498,392 | 2/1950 | Boyle | 248/657 |
| 3,159,368 | 12/1964 | Ahlbin et al. | 248/222.4 |
| 3,473,773 | 10/1969 | Meyer | 248/222.4 |
| 3,850,392 | 11/1974 | Gassaway | 248/553 |
| 3,934,829 | 1/1976 | Coucher | 248/657 X |
| 4,106,630 | 8/1978 | Rosenband | 248/223.1 X |
| 4,258,464 | 3/1981 | Ullman | 248/222.4 X |
| 4,275,939 | 6/1981 | Odermann | 248/544 X |
| 4,492,169 | 1/1985 | Ware et al. | 248/222.4 X |
| 4,502,656 | 3/1985 | Zeitler | 248/678 X |

*Primary Examiner*—Ramon O. Ramirez
*Attorney, Agent, or Firm*—Finnegan, Henderson, Farabow, Garrett & Dunner

[57] ABSTRACT

An improved system for fixedly mounting a case or the like box-shaped article onto the body of a motorcar is disclosed. The case is first placed on a mounting base fixedly secured to the body of motorcar by fitting a plurality of projections into holes on the mounting base and thereafter by operating a displacing device with the aid of a key the case is displaced relative to the mounting base so that the former is fixedly mounted on the latter. Each of the projections is formed with a V-shaped annular groove and each of the holes includes a larger diameter portion of which diameter is dimensioned larger than that of the projections and a smaller diameter portion formed by cutting a part of the larger diameter portion with a circle having the diameter dimensioned smaller than that of the larger diameter portion. Thus, the case is immovably mounted on the mounting base when the periphery of the smaller diameter portions of the holes are wedged between the upper and lower inclined parts in the V-shaped annular grooves on the projections. The case is normally constituted by a combination of upper cover and lower cover both of which are connected to one another by means of a plurality of fastening bolts of which head serves as a projection. The displacing device includes a tongue on the mounting base and a screw on the case and the latter is rotated by the key which is actuated from the outside of the device.

9 Claims, 10 Drawing Figures

SYSTEM FOR FIXEDLY MOUNTING A CASE OR THE LIKE BOX-SHAPED ARTICLE

BACKGROUND OF THE INVENTION

1. Field of the Invention

The present invention relates to a system for fixedly mounting a case or the like box-shaped article and more particularly to a system for fixedly mounting a case or the like box-shaped article for housing therein an electric appliance such as receiver or the like to the body of a vehicle such as a motorcar.

2. Description of the Prior Art

To fixedly mount a case for housing an electric appliance such as receiver or the like to the body of a motorcar there are hitherto made a variety of proposals. To facilitate understanding of the present invention, it will be helpful that typical conventional systems for fixedly mounting a case or the like box-shaped article are briefly described below with reference to FIGS. 1 and 2 each of which is a perspective view of a mounting base and a case employed for carrying out the conventional system, shown in a disassembled state.

In the conventional system as illustrated in FIG. 1, a case 2 to be fixedly mounted is adapted to be slidably fitted onto mounting base 1 usable for fixedly mounting on motor car (hereinafter referred to simply as mounting base). In the illustrated case the mounting base is formed by bending both the end parts of a plate.

Specifically, the case 2 is inserted into the mounting base 1 to reach a predetermined position located in the latter while the bottom of the case 2 is slidably displaced along guide rails 1a and 1b on both the ends of the mounting base 1 in the direction as identified by an arrow mark A. At this moment a tongue (not shown) on a fastener 3 disposed on each of the side walls of the mounting base 1 is fitted into a groove 2a on each of the side walls of the case 2. As a screw 3 on the fastener 3 is tightened, the tongue is moves upwardly into a recess 2a' on the guide groove 2a and it is then brought in abutment against the end face of the recess 2a' whereby the case 2 is fixedly mounted on the mounting base 1.

On the other hand, in the conventional system as illustrated in FIG. 2 a mounting base 10 usable for fixedly mounting on motorcar (hereinafter referred to simply as mounting base) includes a plurality of tongues 11 and 12 with cutouts 11a and 12a formed on both the side walls thereof and pins 14 and 15 projecting outwardly of the side walls of a case 12 are inserted into the cutouts 11a and 12a. Thereafter, a set screw 16 is tightened whereby the case 13 is fixedly mounted on the mounting base 10.

It should be noted that the mounting bases 1 and 10 are fixedly secured to the body of a motorcar at the predetermined position by tightening set screws (not shown) screwed through threaded holes 1b and 10b on the upper surface 1a and the lower surface 10a thereof.

In case of the conventional system as illustrated in FIG. 1 there is necessity for sparing the space of which length is determined longer than the dimension as measured in the direction of sliding movement of the case 2 so as to allow the latter to be fitted into the mounting base 1, because the case 2 is fixedly mounted on the mounting base 1 by inserting the former into the latter. Another drawback of the conventional system is that the case 2 tends to be displaced in the vertical direction in the form of vibration during movement of a motorcar, because firm mounting of the case 2 is achieved merely by abutment of the tongue against the upper end face of the recess 2a'.

On the other hand, in case of the conventional system as illustrated in FIG. 2 displacing of the case 13 in the vertical direction as well as in the longitudinal direction is inhibited bacause the case 13 is fixedly mounted on the mounting base 10 by way of the steps of inserting the pins 14 and 15 into the cutouts 11a and 12a and then thrusting the former against the bottom of the latter by tightening the set screw 16. However, the case 13 tends to move idly in the transverse direction (as identified by arrow marks B in FIG. 2) due to dimensional tolerance specified for both the mounting base 10 and the case 12.

SUMMARY OF THE INVENTION

Thus, the present invention has been made with the foregoing drawbacks of the conventional systems in mind.

It is an object of the invention to provide an improved system for fixedly mounting a case or the like box-shaped article which is entirely free from the drawbacks of the conventional systems as mentioned above.

It is an other object of the invention to provide an improved system for fixedly mounting a case or the like box-shaped article which requires the minimized space for the purpose of firm mounting.

It is another object of the invention to provide an improved system for fixedly mounting a case or the like box-shaped article which assures no occurrence of idle displacing of the case during movement of a motorcar.

To accomplish the above objects there is proposed according to the present invention an improved system for fixedly mounting a case or the like box-shaped article onto the body of a vehicle such as a motorcar, wherein the improvement comprises engaging means for engaging the one surface of the case to the one surface of a mounting base and displacing means for displacing the case relative to the mounting base after the former is placed on the one surface of the latter so that the former is firmly engaged to the latter.

In an embodiment of the invention the engaging means comprises a plurality of projections with a V-shaped annular groove formed thereon respectively, each of the projections being projected downwardly of the case, and a plurality of holes formed on the mounting base at the position located opposite to the projections whereby the periphery of the holes is firmly wedged between the upper and lower inclined parts of the V-shaped annular groove on the projections after the latter are inserted into the holes.

The displacing means comprises a displacing device including a tongue standing upright on the mounting base and a male threaded screw disposed on the case at the position located opposite to a female threaded hole at the central part of the tongue to be threadably engaged to the latter.

After the projections on the case are inserted into the holes on the mounting base, the displacing device is operated to displace the case relative to the mounting base until the periphery of the holes is firmly engaged to the V-shaped annular groove on the projections. Thus, the case is immovably mounted on the mounting base.

According to the invention, firm mounting of the case on the mounting base is achieved by way of the steps of inserting the projections on the case or the mounting base into the holes on the mounting base or the case and then displacing the case relative to the mounting base with the aid of the displacing device until the periphery of the holes is engaged to the annular groove on the projections. Therefore, a space required for mounting operation can be minimized. Other advantageous feature of the invention is that dimensional error inherent to each of articles can be absorbed owing to the arrangement that firm mounting is achieved by engaging the periphery of the holes to the annular groove on the projections. Another advantageous feature of the invention is that there occurs no idle movement of the case on the mounting base in any direction after firm mounting of the case is achieved.

Other objects, features and advantages of the invention will become more clearly apparent from reading of the following description which has been prepared in conjunction of the accompanying drawings.

BRIEF DESCRIPTION OF THE DRAWINGS

The accompanying drawings will be briefly described below.

DESCRIPTION OF THE PREFERRED EMBODIMENTS

Now, the present invention will be described in a greater detail hereunder with reference to FIGS. 3 to 10 which illustrate preferred embodiments thereof.

Figure 1:
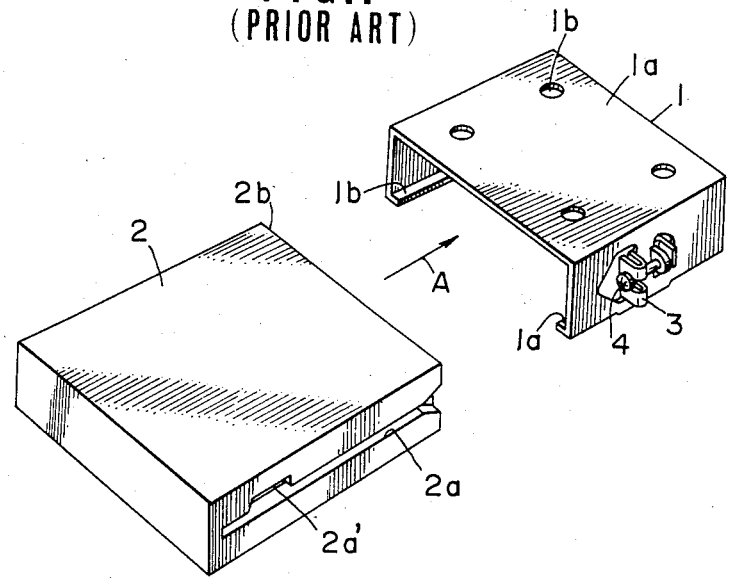
FIG. 1 is a perspective view of a conventional system for immovably mounting a case on a mounting base, shown in the disassembled state.
Figure 2:
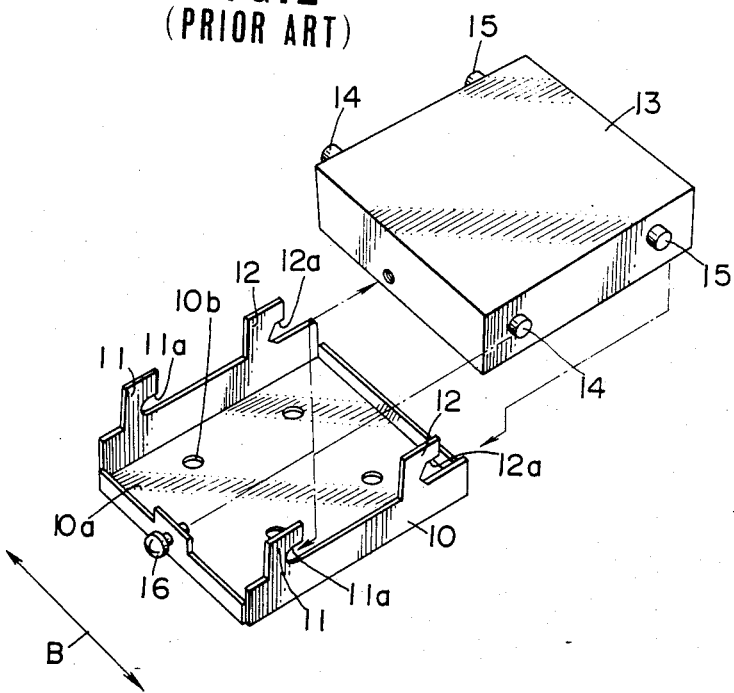
FIG. 2 is a perspective view of another conventional system for immovably mounting a case on a mounting base, shown in the disassembled state.
Figure 3:
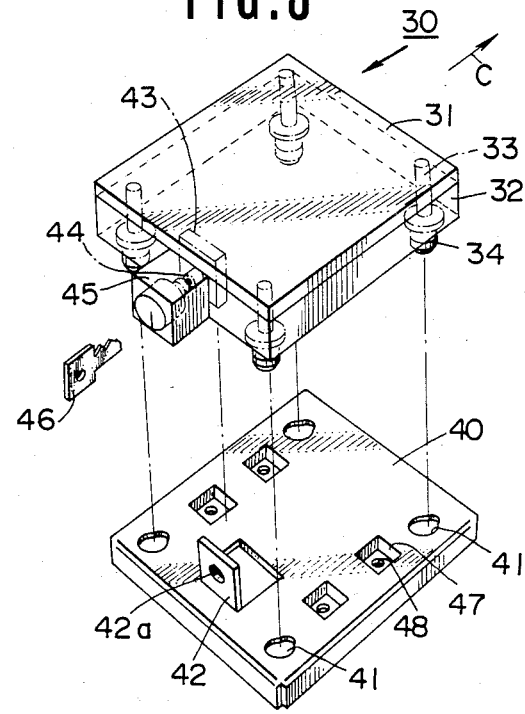
FIG. 3 is a perspective view of a system for immovably mounting a case on a mounting base in accordance with the first embodiment of the invention, shown in the disassembled state.
Figure 4:
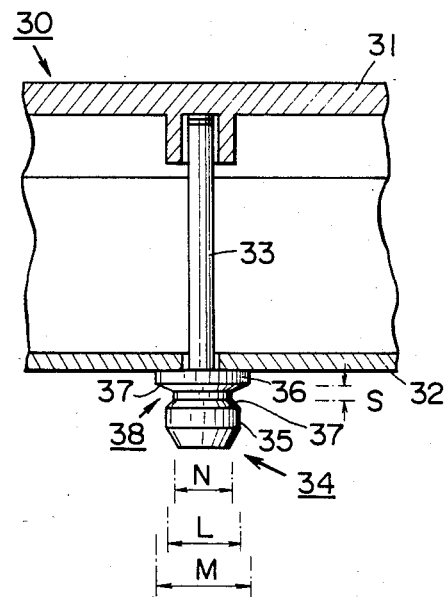
FIG. 4 is an enlarged fragmental vertical sectional view of the system in FIG. 3, particularly illustrating how a fastening bolt of which head serves as a projection is threadably secured to the case.
Figure 5:
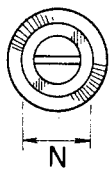
FIG. 5 is a view of the fastening bolt as seen from the below in FIG. 4.
Figure 6:
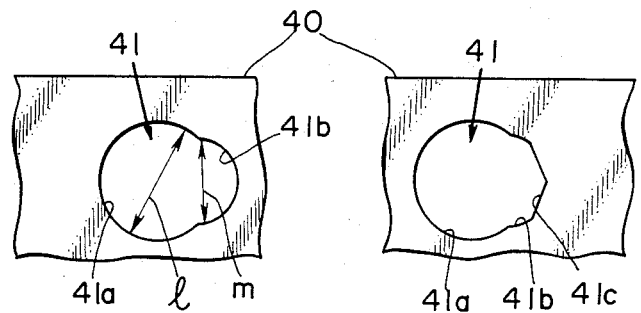
FIG. 6 is an enlarged fragmental plan view of the mounting base, particularly illustrating how the holes through which the projections are inserted are designed.
Figure 7:
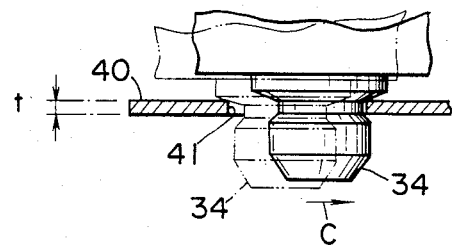
FIG. 7 is an enlarged fragmental side view of the system, particularly illustrating how the projection on the fastening bolt is engaged to the periphery of the hole on the mounting base.

Description will be first made as to a system in accordance with the first embodiment of the invention with reference to FIGS. 3 to 8. As illustrated in FIG. 3, a case 30 includes an upper cover 31 and a lower cover 32 both of which are connected to one another by means of fastening bolts 33 which are inserted through the lower cover 32 to be threadably fitted to the upper cover 31. As will be best seen from FIGS. 4 and 5, the fastening bolts 33 are so designed that their head 34 is projected downwardly of the lower cover 32 of the case 30. The head 34 of each of the fastening bolts 33 comprises a smaller diameter portion 35 and a larger diameter portion 36, and an annular groove 38 having a V-shaped sectional configuration is provided between both the smaller and larger diameter portions 35 and 36. It should be noted that the diameter L of the smaller diameter portion 35 is determined appreciably smaller than the diameter l of a larger diameter portion 41a of a hole 41 formed on a mounting base 40 to be described later and the diameter M of the larger diameter portion 36 is determined appreciably larger than the diameter l of the same (see FIG. 6). Further, the inner diameter N of the annular groove 38 on the head 34 is determined appreciably smaller than the diameter m of a smaller diameter portion 41b of the hole 41 on the mounting base 40 (see FIG. 6) and the width S of the bottom of the annular groove 38 is determined appreciably smaller than the wall thickness t of the mounting base 40 (see FIG. 7). As is apparent from FIG. 3, the mounting base 40 for firmly mounting the case 30 thereon is designed in the flat box-shaped configuration of which four side walls are formed by bending a plate material and four holes 41 are punched on the surface of the mounting base 40 at the position located corresponding to the heads 34 of the fastening bolts 33. Each of the holes 41 comprises a larger diameter portion 41a and a smaller diameter portion 41b which is formed by cutting a part of the larger diameter portion 41a with a circle having a certain small diameter, as illustrated in FIG. 6. Thus, engagement means for both the case 30 and the mounting base 40 is constituted by a combination of projected parts on the case 30 and holes 41 on the mounting base 40.

Among four holes 41 as described above two holes 41 located at the rear part of the mounting base 40 as seen in FIG. 3 have an inclined portion 41c respectively which is united with the smaller diameter portion 41b at the rear part thereof as seen in FIG. 6. It should be noted that the smaller diameter portions 41b are formed at the position located in the same direction as seen rearwardly relative to the mounting base 40.

The mounting base 40 includes an upright standing tongue 42 which is fixedly secured thereto at the fore end part and a female threaded hole 42a is formed at the central part of the tongue 42. Further, the lower cover 32 of the case 30 includes an upright standing bracket 43 which is fixedly secured thereto at the position located opposite to the tongue 42. A displacing device 45 with a lock fitted thereto is disposed on the lower cover 32 of the case 30 at the position located forwardly of the bracket 42 and the lock is operatively connected to a male threaded screw 44 adapted to move toward the bracket 43.

Incidentally, displacing means is constituted by a combination of the tongue 42 standing upright from the mounting base 40 and the displacing device 45 as constructed in the above-described manner.

Figure 8:
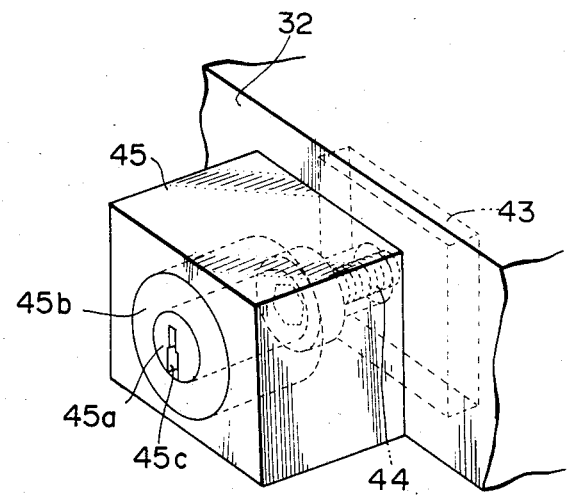
FIG. 8 is an enlarged perspective view of a displacing device for the system in FIG. 1.

As is apparent from FIG. 8, the displacing device 45 comprises an inner sleeve 45a and an outer sleeve 45b and the screw 44 is connected to the inner sleeve 45a. To rotate the screw 44 the displacing device 45 includes a key 46 as illustrated in FIG. 3 which is adapted to be inserted into a key hole 45c. In FIG. 3 reference numeral 47 designates a recess formed on the mounting base 40. On the bottom of each of the recesses 47 is formed a threaded hole 48 which serves to fixedly secure the mounting base 40 to a car body at a predetermined position with the aid of set screws which are not shown in the drawings.

In the above-described embodiment column-shaped projections are provided by utilizing the heads 34 of the fastening bolts 33 projected downwardly of the lower cover 32 of the case 30. However, the present invention should not be limited to this embodiment. Alternatively, separate column-shaped projection having the same configuration as that of the head 34 of the fastening screw 33 may be fitted to the case 30. Further, in the above-described embodiment four column-shaped projections and four holes 41 are arranged at the position located opposite to one another. However, the present invention should not be limited to this number of projections and holes. What is to be done is that a plurality of projections on the lower cover 32 of the case 30 are arranged at the position located opposite to the same number of holes on the mounting base 40.

Next, operation of the system of the invention will be described below.

First, the mounting base 40 is fixedly secured to the car body at the predetermined position. Next, the heads 34 of the fastening screws 33 are inserted into the larger diameter portions 41a of the holes 41 on the upper surface of the mounting base 40 (as illustrated by phantom lines in FIG. 7). The male threaded screw 44 of the displacing device 45 is then threadably engaged to the female threaded hole 42a on the tongue 42 by rotating the key 46. As the latter is rotated further, the case 30 is caused to move forward relative to the mounting base 40 in the direction as identified by an arrow mark C in FIG. 3 whereby the heads 34 of the fastening bolts 33 assume the position as illustrated by real lines in FIG. 7. Namely, they are displaced to the smaller diameter portions 41b of the holes 41. Since the wall thickness t of the mounting base 40 is determined larger than the width S of the bottom of the annular groove 38 on the heads 34 of the fastening screws 33, it results that the heads 34 of the fastening screws 33 are displaced to the smaller diameter portions 41b while the inclined parts 37 of the annular grooves 38 are guided along the periphery of the smaller diameter portion 41b and when the latter is wedged between the upper and lower inclined parts 37 of the annular grooves 38, the heads 34 are stopped and thereby they are located immovably. Since among four holes 41 on the mounting base 40 two holes 41 located at the rear part of the mounting base 40 have an inclined portion 41c adjacent to the smaller diameter portion 41b respectively, it is assured that the heads 34 of the fastening bolts 33 are located exactly with the aid of the inclined portions 41c of the holes 41 in the longitudinal direction as well as in the transverse direction relative to the case 30. Further, since they are located in such a manner that the periphery of the smaller diameter portions 41b of the holes 41 is wedged between the upper and lower inclined parts 37 of the annular groove 38, it is assured that the case 30 is fixedly mounted on the mounting base 40 without occurrence of idle movement of the former relative to the latter not only in the longitudinal and transverse directions but also in the vertical direction.

In the above-described embodiment the displacing device 45 with a lock incorporated therein of the type including a female threaded hole 42a on the tongue 42 standing upright on the mounting base 40 and a male threaded screw 44 adapted to be threadably engaged to the female threaded hole 42a is employed for displacing the case 30 relative to the mounting base 40. However, it should of cource be understood that the present invention should not be limited only to this embodiment.

Figure 9:
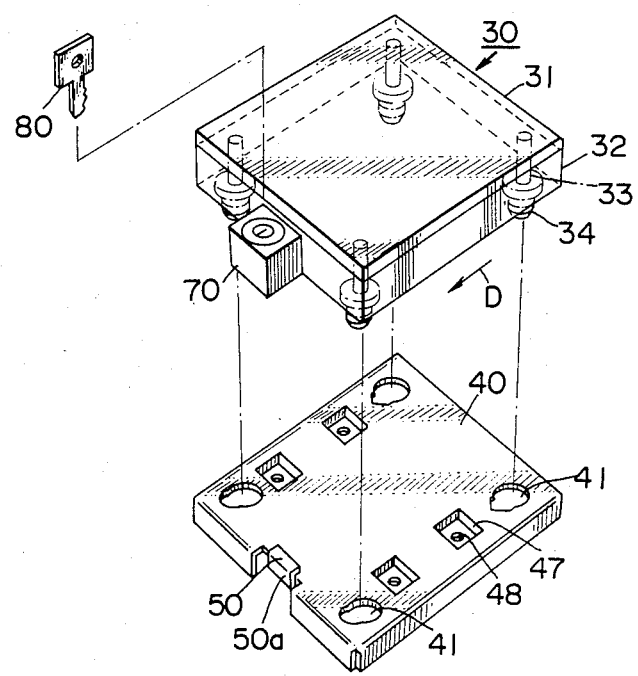
FIG. 9 is a perspective view of a system for immovably mounting a case on a mounting base in accordance with the second embodiment of the invention, shown in the disassembled state.
Figure 10:
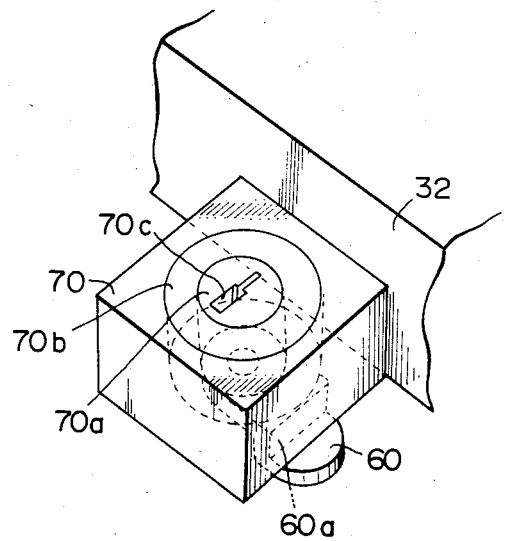
FIG. 10 is an enlarged perspective view of a displacing device for the system in FIG. 9.

Alternatively, the present invention may be embodied as illustrated in FIG. 9. It should be noted that same or similar parts or components as those in FIG. 3 are identified by same reference numerals.

Specifically, in the second embodiment of the invention a displacing device 70 with a lock incorporated therein of the type including a pressure actuated piece 50 made of resilient material disposed at the fore end of the mounting base 40 and a turnable tongue 60 having the stepped configuration (see FIG. 10) adapted to abut against the front surface 50a of the pressure actuated piece 50 to displace the case 30 in the direction as identified by an arrow mark D is employed for the system. It should be noted that the smaller diameter portions of the holes 41 on the mounting base 40 in this embodiment are oriented in the reverse direction to those in the first embodiment as illustrated in FIG. 3. As is apparent from FIG. 10, the displacing device 70 includes an inner sleeve 70a and an outer sleeve 70b and the inner sleeve 70a is fixedly connected to the tongue 60. When the tongue 60 is to be turned, a key 80 as illustrated in FIG. 9 is inserted into a key hole 70c on the inner sleeve 70a. As the key 80 is rotated to turn the tongue 60, the stepped face 60a of the tongue 60 is brought in pressure contact with the front surface 50a of the pressure actuated piece 50.

Since in the second embodiment the pressure actuated piece 50 is made of resilient material, it is assured that any minor dislocating of the heads 34 of the fastening bolts 33 relative to the holes 41, that is, dimensional error inherent to each of articles is effectively absorbed by resilient deformation of the pressure actuated piece 50, after the case is firmly mounted on the mounting base 40.

It should be added that the case 30 is normally thrusted in the one direction under the effect of resilient force of the pressure actuated piece 50, after the case 30 is mounted on the mounting base 40.

Further, instead of providing a projection on one surface of the case 30 and forming a hole to be engaged with the projection on the mounting base 40, it may be so constructed that the projection is provided on the mounting base 40 while the hole is formed on the surface of the case 30.

While the present invention has been described above with respect to two preferred embodiments thereof, it should of course be understood that it should not be limited only to them but various changes or modifications may be made in any acceptable manner without departure from the spirit and scope of the invention.

What is claimed is:

1. In a system for fixedly mounting a case or the like box-shaped article, the improvement comprising:
   engaging means for in combination, a case or the like and a mounting base, engaging one surface of the case to one surface of the mounting base, said engaging means comprising a plurality of column-shaped projections with an annular groove formed thereon respectively, said projections provided on either one of the one surface of the case or the one surface of the mounting base, and a plurality of holes formed on the other one of the one surface of the mounting base or the one surface of the case at the position located opposite to the projections, said holes being formed with a first portion of larger diameter and a second portion of smaller diameter, the periphery of the larger diameter portion of said holes receiving the projections during their insertion into the holes, and displacing means for displacing the case relative to the mounting base after the formed is placed on the one surface of the latter so that the projections are moved into the smaller diameter portions of the openings and are firmly engaged by the latter said displacing means comprising a tongue standing from the mounting base and a locking means at the one surface of the case cooperating with said tongue.

2. A system as defined in claim 1, wherein the annular groove has a V-shaped sectional configuration having a cross-sectional area increasing toward the outer surface of the projections and having a bottom having a width which is less than the wall thickness of the mounting base.

3. A system as defined in claim 1, wherein each of the holes includes a larger diameter portion of which diameter is larger than that of the projections at the lower end thereof and a smaller diameter portion formed by cutting a part of the larger diameter portion with a circle having the diameter smaller than that of the larger diameter portion.

4. A system as defined in claim 1, wherein at least one hole on said mounting base includes an inclined portion adjacent to a smaller diameter portion.

5. A system as defined in claim 1, wherein the case includes a combination of an upper cover and a lower cover both connected to one another by a plurality of fastening bolts having heads constituting said column-shaped projections.

6. In a system for fixedly mounting a case or the like box-shaped article, the improvement comprising:

in combination a case or the like and a mounting base, engaging means for engaging one surface of the case to one surface of the mounting base, and displacing means for displacing the case relative to the mounting base after the former is placed on the surface of the latter so that the former is firmly engaged to the latter, said displacing means including a pressure actuated piece disposed at the force end of the mounting base and a tongue disposed on the case at a position located opposite to said pressure actuated piece and adapted to come into pressure contact with a surface of the pressure actuated piece.

7. A system as defined in claim 6, wherein the pressure actuated piece is made of resilient material.

8. A system as defined in claim 6, wherein the tongue is operatively connected to an inner sleeve adapted to be rotated by means of a key which is actuated from the outside of the displacing means.

9. In a system for fixedly mounting a case or the like box-shaped article, the improvement comprising:

in combination, a case or the like and a mounting base, engaging means for engaging one surface of the case to one surface of the mounting base, said engaging means comprising a plurality of column-shaped projections with an annular groove formed thereon respectively, said projections provided on either one of the one surface of the case or the one surface of the mounting base, and a plurality of holes formed on the other one of the one surface of the mounting base or the one surface of the case at the position located opposite to the projections, said holes being formed with a first portion of larger diameter and a second portion of smaller diameter, the periphery of said larger diameter portions holes receiving the projections after the later are inserted into the holes, and displacing means for displacing the case relative to the mounting base after the former is placed on the one surface of the latter so that the projections are moved into the smaller diameter portions of the opening and are firmly engaged by the latter, said displacing means including a pressure actuated piece disposed at the fore end of the mounting base and a tongue disposed on the case at a position located opposite to said pressure actuated piece and adapted to come into pressure contact with a surface of the pressure actuated piece.

* * * * *